United States Patent
Li et al.

(10) Patent No.: US 11,640,512 B2
(45) Date of Patent: May 2, 2023

(54) MULTIMEDIA CARD AND MOBILE ELECTRONIC DEVICE

(71) Applicant: Huawei Technologies Co., Ltd., Shenzhen (CN)

(72) Inventors: Zhongzheng Li, Shenzhen (CN); Jian Zhou, Shenzhen (CN); Zhixiong Li, Shenzhen (CN); Jingyang Wang, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 49 days.

(21) Appl. No.: 17/276,072

(22) PCT Filed: Jul. 17, 2019

(86) PCT No.: PCT/CN2019/096436
§ 371 (c)(1),
(2) Date: Mar. 12, 2021

(87) PCT Pub. No.: WO2020/052346
PCT Pub. Date: Mar. 19, 2020

(65) Prior Publication Data
US 2022/0051068 A1    Feb. 17, 2022

(30) Foreign Application Priority Data
Sep. 13, 2018    (CN) .......................... 201811069348.0

(51) Int. Cl.
*G06K 19/06*      (2006.01)
*G06K 19/077*     (2006.01)

(52) U.S. Cl.
CPC .............................. *G06K 19/07743* (2013.01)

(58) Field of Classification Search
CPC ....... G06K 19/07743; G06K 19/07749; G06K 19/077; G06Q 20/341; G06Q 20/352
(Continued)

(56) References Cited

U.S. PATENT DOCUMENTS

2005/0041509 A1*  2/2005  Kumahara ............. G11C 16/30
                                                365/226
2006/0049263 A1   3/2006  Ou et al.
(Continued)

FOREIGN PATENT DOCUMENTS

CN       1581357 A      2/2005
CN       1696972 A     11/2005
(Continued)

*Primary Examiner* — Daniel St Cyr
(74) *Attorney, Agent, or Firm* — Leydig, Voit & Mayer, Ltd.

(57) ABSTRACT

A multimedia card includes a substrate, and a main control chip, a memory chip, and an interface contacts that are disposed on the substrate. The main control chip and the memory chip are covered with a packaging layer. The interface contacts includes a power contact, configured to receive a first voltage that is input from the outside; and a transformer circuit is further disposed on the substrate, is coupled to the interface contacts, the main control chip, and the memory chip, and is configured to convert the input first voltage into a second voltage, to provide two types of power supplies with the first voltage and the second voltage for the main control chip and the memory chip. In the foregoing manner, an area of the multimedia card is reduced, and a quantity of working modes of the multimedia card increases.

20 Claims, 5 Drawing Sheets

(58) Field of Classification Search
USPC .......................................... 235/492, 487, 488
See application file for complete search history.

(56) References Cited

U.S. PATENT DOCUMENTS

| | | | |
|---|---|---|---|
| 2007/0075140 A1* | 4/2007 | Guez ................. | G06K 19/0723 235/435 |
| 2007/0164119 A1* | 7/2007 | Liu .................... | G06K 19/0723 235/492 |
| 2008/0257967 A1* | 10/2008 | Nishizawa .......... | G06K 19/072 711/115 |
| 2012/0089766 A1* | 4/2012 | Yu ......................... | G11C 5/143 365/189.16 |
| 2016/0217455 A1* | 7/2016 | Hosny ................ | G06Q 20/4012 |

FOREIGN PATENT DOCUMENTS

| | | |
|---|---|---|
| CN | 1713112 A | 12/2005 |
| CN | 109284808 A | 1/2019 |

\* cited by examiner

MULTIMEDIA CARD AND MOBILE ELECTRONIC DEVICE

CROSS-REFERENCE TO RELATED APPLICATIONS

This application is a National Stage of International Application No. PCT/CN2019/096436, filed on Jul. 17, 2019, which claims priority to Chinese Patent Application No. 201811069348.0, filed on Sep. 13, 2018. Both of the aforementioned applications are hereby incorporated by reference in their entireties

TECHNICAL FIELD

Embodiments of this application relate to the field of memory card technologies, and in particular, to a multimedia card and a mobile electronic device.

BACKGROUND

A SIM (Subscriber Identification Module) card is also referred to as a subscriber identity module card or a smart card, and a GSM digital mobile phone needs to be equipped with the SIM card for use. An SD memory card is a new-generation memory device based on a semiconductor flash memory, and is widely used in portable apparatuses because of excellent characteristics of the SD memory card, such as a small size, a high data transfer speed, and a hot-pluggable characteristic.

With development of mobile terminals, currently, two card slots are usually disposed in one card tray, so that both the SIM card and the SD card can be installed.

SUMMARY

A technical solution used in this application is to provide a multimedia card. The multimedia card includes a substrate, and a main control chip, a memory chip, and an interface contacts that are disposed on the substrate. The main control chip and the memory chip are covered with a packaging layer. The interface contacts includes a power contact, configured to receive a first voltage that is input from the outside; and a transformer circuit is further disposed on the substrate, is coupled to the interface contacts, the main control chip, and the memory chip, and is configured to convert the input first voltage into a second voltage, to provide two types of power supplies with the first voltage and the second voltage for the main control chip and the memory chip.

Another technical solution used in this application is to provide a mobile electronic device. The mobile electronic device includes a SIM card slot and a memory card slot that are disposed on a same card tray. The SIM card slot and the memory card slot have a same shape, and the memory card slot is configured to accommodate the foregoing multimedia card.

The multimedia card provided in this application includes the substrate, and the main control chip, the memory chip, and the interface contacts that are disposed on the substrate. The main control chip and the memory chip are covered with the packaging layer. The interface contacts includes the power contact, configured to receive the first voltage that is input from the outside; and the transformer circuit is further disposed on the substrate, is coupled to the interface contacts, the main control chip, and the memory chip, and is configured to convert the input first voltage into the second voltage, to provide the two types of power supplies with the first voltage and the second voltage for the main control chip and the memory chip. In the foregoing manner, on the premise of ensuring a small size of the multimedia card, no additional power contact is added, only one power contact is used to connected to an external power supply with a single voltage, and a plurality of power supplies are formed by using the transformer circuit, thereby ensuring a multi-mode working environment of the multimedia card. An area of the multimedia card is reduced, and a quantity of working modes of the multimedia card increases.

BRIEF DESCRIPTION OF DRAWINGS

To describe the technical solutions in the embodiments of this application more clearly, the following briefly describes the accompanying drawings for describing the embodiments. It is clear that the accompanying drawings in the following descriptions show merely some embodiments of this application, and a person of ordinary skill in the art may further derive other accompanying drawings from these accompanying drawings without creative efforts.

DESCRIPTION OF EMBODIMENTS

Mentioning an "embodiment" in the specification means that a particular characteristic, structure, or feature described with reference to the embodiments may be included in at least one embodiment of this application. The phrase shown in various locations in the specification may not necessarily refer to a same embodiment, and is not an independent or optional embodiment exclusive from another embodiment. It is explicitly and implicitly understood by a person skilled in the art that the embodiments described in the specification may be combined with another embodiment.

Figure 1:
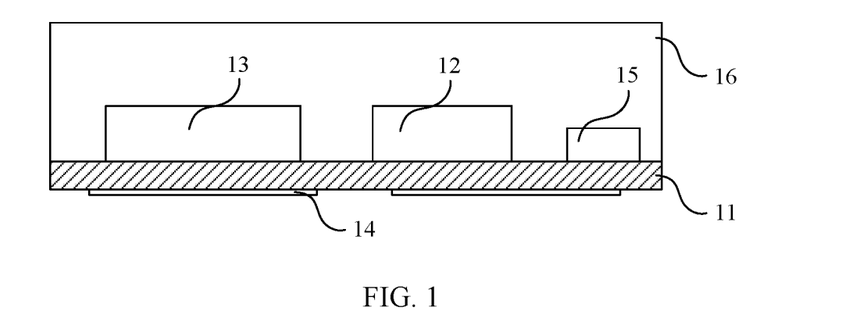
FIG. 1 is a schematic structural diagram of a first embodiment of a multimedia card according to this application.

FIG. 1 is a schematic structural diagram of a first embodiment of a multimedia card according to this application. The multimedia card includes a substrate 11, and a main control chip 12, a memory chip 13, and an interface contacts 14 that are disposed on the substrate 11.

Optionally, a passive element 15 may be further disposed on the substrate 11. The passive element 15 may include common circuit components such as a resistor, a capacitor, and an inductor.

In this embodiment, the main control chip 12, the memory chip 13, and the passive element 15 are covered with a packaging layer 16. In this embodiment, the main control chip 12 and the memory chip 13 are unpackaged dies. Usually, there are eight memory chips 13, which are NAND flash chips, and are stacked on a surface of the substrate 11 layer by layer. In addition, in other embodiments, the main control chip 12 and the memory chip 13 may alternatively be packaged chips.

In an optional embodiment, the main control chip 12, the memory chip 13, and the passive element 15 are disposed on one side face of the substrate 11, and the interface contacts 14 is disposed on the other opposite side face of the substrate 11.

Figure 2:
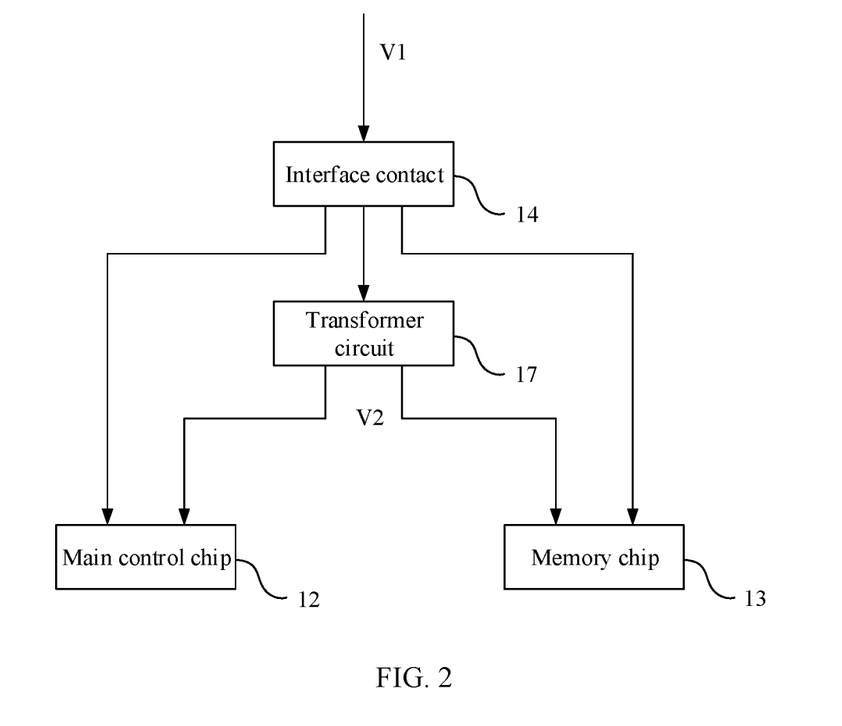
FIG. 2 is a schematic diagram of a circuit structure of a first embodiment of a multimedia card according to this application.

FIG. 2 is a schematic diagram of a circuit structure of a first embodiment of a multimedia card according to this application. The multimedia card further includes a transformer circuit 17 (not shown in FIG. 1), coupled to the interface contacts 14, the main control chip 12, and the memory chip 13. The interface contacts 14 is configured to receive a first voltage V1 that is input from the outside, and the transformer circuit 17 is configured to convert the input first voltage V1 into a second voltage V2, to provide two types of power supplies with the first voltage V1 and the second voltage V2 for the main control chip 12 and the memory chip 13.

It may be understood that the interface contacts is coupled to the transformer circuit 17, the main control chip 12, and the memory chip 13, and therefore, the first voltage V1 may be directly provided for the main control chip 12 and the memory chip 13. The transformer circuit 17 is coupled to the main control chip 12 and the memory chip 13, and therefore, after the first voltage V1 is converted by the transformer circuit 17, the second voltage V2 may be provided for the main control chip 12 and the memory chip 13.

In this embodiment, the transformer circuit 17 may also be disposed on the substrate 11, and is covered with the packaging layer 16.

Figure 3:
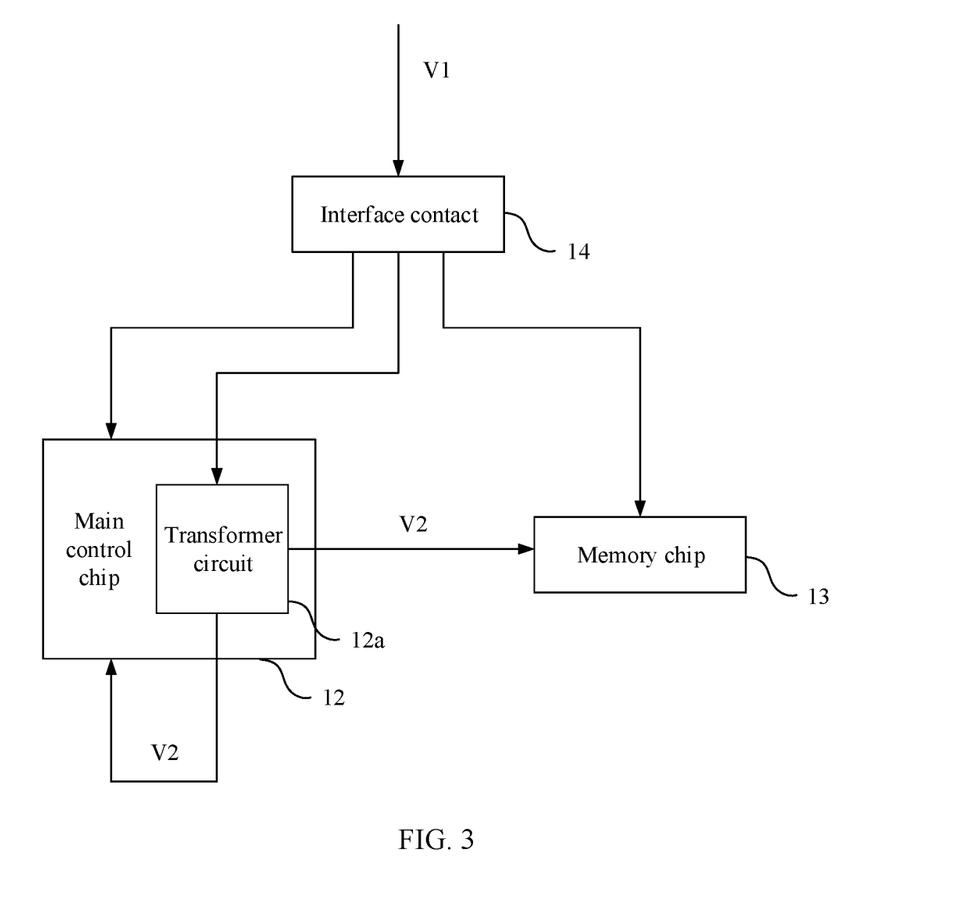
FIG. 3 is a schematic diagram of another circuit structure of a first embodiment of a multimedia card according to this application.

In another embodiment, FIG. 3 is a schematic diagram of another circuit structure of a first embodiment of a multimedia card according to this application. In this embodiment, a transformer circuit 12a is integrated into the main control chip 12.

It may be understood that the interface contacts is coupled to the transformer circuit 12a, the main control chip 12, and the memory chip 13, and therefore, a first voltage V1 may be directly provided for the main control chip 12 and the memory chip 13. The transformer circuit 12a is coupled to the main control chip 12 and the memory chip 13, and therefore, after the first voltage V1 is converted by the transformer circuit 12a, a second voltage V2 may be provided for the main control chip 12 and the memory chip 13.

In this embodiment, to reduce an area of the multimedia card, a quantity of interface contacts is reduced as much as possible on the premise that more memory card working modes can be supported. Because of multi-mode working performance of the multimedia card, different voltages need to be used. Therefore, the transformer circuit provides an additional voltage for the multimedia card, so that the multimedia card can work in more modes. It may be understood that, when the multimedia card works in a first mode, the multimedia card uses the first voltage V1; or when the multimedia card works in a second mode, the multimedia card uses the second voltage V2.

The multimedia card provided in this application includes the substrate, and the main control chip, the memory chip, and the interface contact that are disposed on the substrate. The main control chip and the memory chip are covered with the packaging layer. The interface contact includes a power contact, configured to receive the first voltage that is input from the outside; and the transformer circuit is further disposed on the substrate, is coupled to the interface contact, the main control chip, and the memory chip, and is configured to convert the input first voltage into the second voltage, to provide the two types of power supplies with the first voltage and the second voltage for the main control chip and the memory chip. In the foregoing manner, on the premise of ensuring a small size of the multimedia card, no additional power contact is added, only one power contact is used to connect an external power supply with a single voltage, and a plurality of power supplies are formed by using the transformer circuit, thereby ensuring a multi-mode working environment of the multimedia card. The area of the multimedia card is reduced, and a quantity of working modes of the multimedia card increases.

Figure 4:
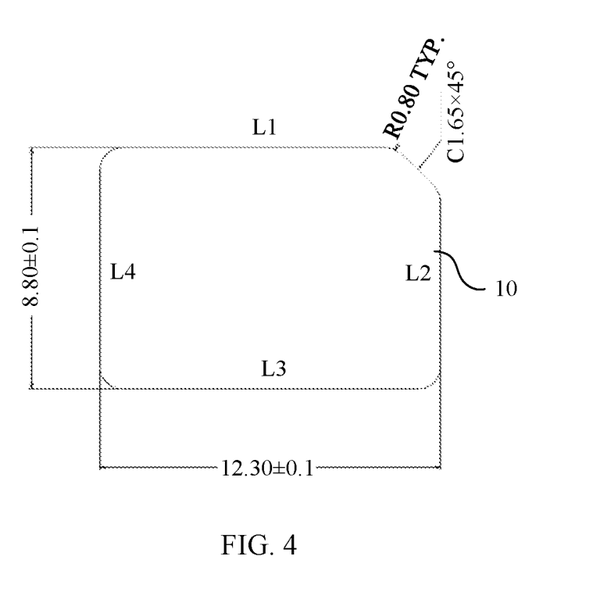
FIG. 4 is a schematic structural diagram of a second embodiment of a multimedia card according to this application.

FIG. 4 is a schematic structural diagram of a second embodiment of a multimedia card according to this application. The multimedia card 10 includes two opposite long edges and two opposite short edges, that is, a first long edge L1, a first short edge L2, a second long edge L3, and a second short edge L4, where a length of the long edge is 12.3±0.1 mm, and a length of the short edge is 8.8±0.1 mm.

Optionally, there is a first chamfered part between a long edge and a short edge that are adjacent to each other, the first chamfered part is a 45° chamfer, and a distance from one end to the other end of the chamfer is 1.65 mm. For example, the first chamfered part is disposed between the first long edge L1 and the first short edge L2.

Optionally, an arc-shaped chamfer is further disposed between the chamfered part and the first long edge L1, and another arc-shaped chamfer is further disposed between the chamfered part and the first short edge L2, where a radius of the arc-shaped chamfer is 0.8 mm.

In addition, chamfers may be disposed between the first long edge L1 and the second short edge L4, between the second short edge L4 and the second long edge L3, and between the second long edge L3 and the first short edge L2.

Optionally, a thickness of the multimedia card 10 is 0.7±0.1 mm.

Figure 5:
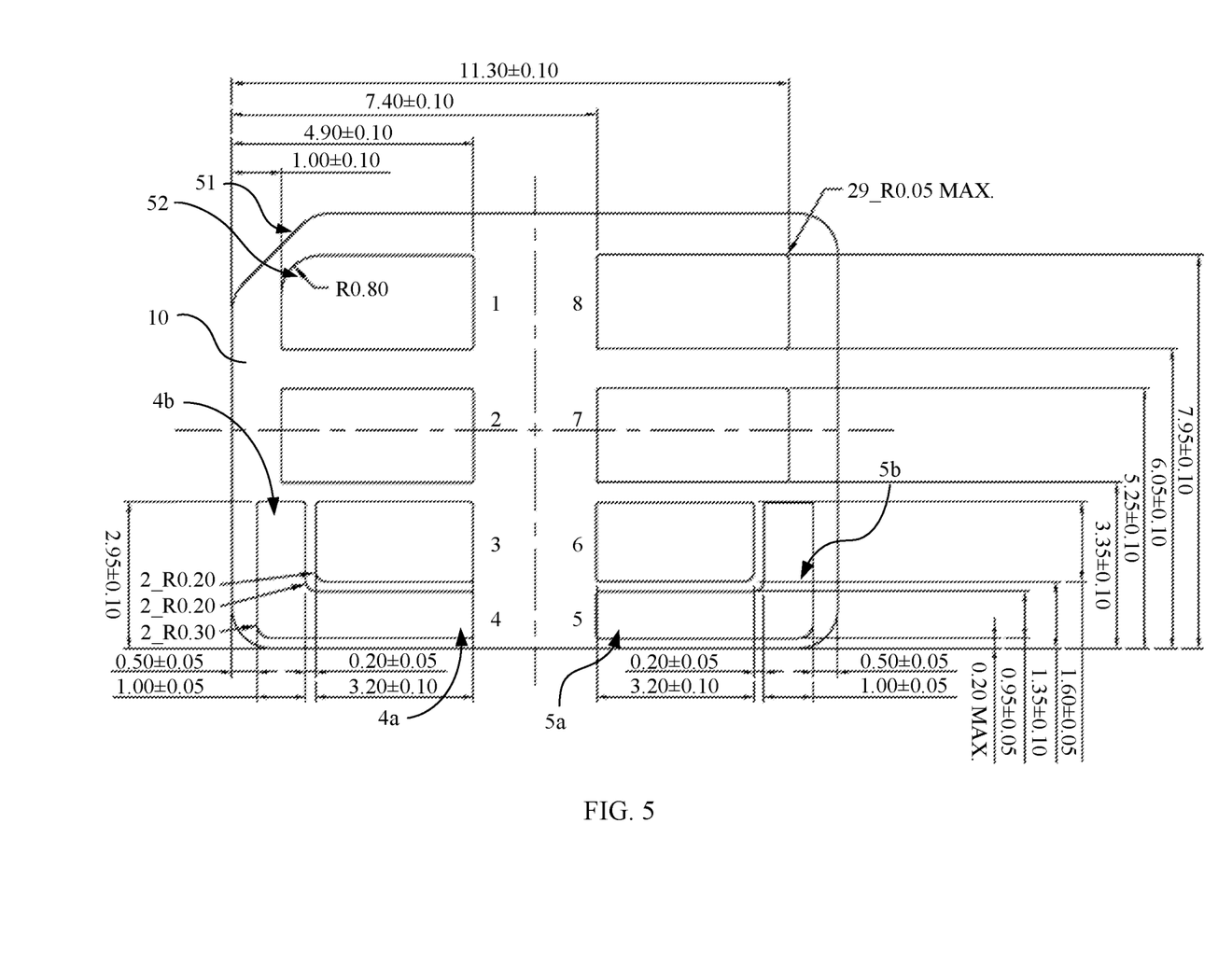
FIG. 5 is a schematic structural diagram of a third embodiment of a multimedia card according to this application.

FIG. 5 is a schematic structural diagram of a third embodiment of a multimedia card according to this application. The multimedia card 10 is a memory card using the eMMC (Embedded Multi Media Card) protocol. eMMC is an embedded memory standard specification formulated by the MMC association mainly for products such as a mobile phone or a tablet computer.

In this embodiment, an interface contact 14 is an interface contact using the eMMC protocol, and includes eight contacts, a power contact is configured to receive a 3.3 V voltage that is input from the outside, and a transformer circuit is configured to convert 3.3 V into 1.8 V.

As shown in FIG. 5, the eight contacts are respectively represented by numbers 1 to 8, and the eight contacts are arranged in a manner of four rows and two columns by using a long edge of the multimedia card 10 as the row and a short edge of the multimedia card 10 as the column. The interface contact includes a first contact, a second contact, a third contact, and a fourth contact that are arranged in the first column in order, and a fifth contact, a sixth contact, a seventh contact, and an eighth contact that are arranged in the second column in reversed order.

Optionally, the first contact corresponds to a first chamfered part 51, and a corner that is of the first contact and that corresponds to the first chamfered part 51 is disposed as a second chamfered part 52.

Optionally, the fourth contact includes an L-shaped first body 4a and a first extension part 4b, and the first extension part 4b extends between the third contact and an adjacent short edge; and the fifth contact includes an L-shaped second body 5a and a second extension part 5b, and the second extension part 5b extends between the sixth contact and an adjacent short edge.

It may be understood that, the contacts are insulated from each other.

In this embodiment, the interface contact 14 is configured to establish an electrical connection between the multimedia card 10 and an external device, and an external interface uses the eMMC protocol. In this embodiment, the interface contact 14 includes a 3.3 V power contact (VCC), a ground contact (GND), a clock contact (CLK), a command contact (CMD), and four data contacts (D0 to D3). In this embodiment, settings of the eight interface contacts are as follows:

| Contact number | Definition |
| --- | --- |
| 1 | D1 |
| 2 | CMD |
| 3 | GND |
| 4 | D3 |
| 5 | D2 |
| 6 | VCC |
| 7 | D0 |
| 8 | CLK |

In the standard eMMC protocol, eight data pins and two power supply inputs, that is, VCC (3.3 V) and VCCQ (3.3 V or 1.8 V), need to be provided. In this embodiment, to reduce an area of the memory card, the eight interface contacts are disposed, and therefore only the 3.3 V power supply input is reserved, and only four data contacts are disposed. The multimedia card in this embodiment supports the following rate modes:

| Mode | Data rate | Bus width | Frequency | Max data transfer (x8) |
| --- | --- | --- | --- | --- |
| Backward compatible | Single | x1, x4, x8 | 0 to 26 MHz | 26 MB/s |
| High speed SDR | Single | x1, x4, x8 | 0 to 52 MHz | 52 MB/s |
| High speed DDR | Dual | x4, x8 | 0 to 52 MHz | 104 MB/s |
| HS200 | Single | x4, x8 | 0 to 200 MHz | 200 MB/s |
| HS400 | Dual | x8 | 0 to 200 MHz | 400 MB/s |

Because the multimedia card 10 provided in the embodiments is only provided with the 3.3 V power contact, and supports only the 3.3 V power supply input, an added transformer circuit 17 is configured to convert the input 3.3 V voltage into a 1.8 V power supply for output, to provide an 1.8 V power supply input for the main control chip 12 and/or the memory chip 13 (when the multimedia card works in the HS200 mode, the main control chip 12 needs to be provided with the 1.8 V power supply input).

In addition, in the foregoing embodiments, indication points may be further disposed on the substrate 11, to indicate locations of the chips in a manufacturing process of the multimedia card 10, so as to facilitate installation of the main control chip 12 and the memory chip 13. It may be understood that these indication points are grounded.

It may be understood that, a shape and a size of the multimedia card provided in the embodiments are consistent with those of a nano-SIM card. Therefore, when the multimedia card is used in an embedded card tray, an occupied card tray area is relatively small, so that a size of the card tray is reduced. Furthermore, in an electronic device, an area of a circuit board in which a metal dome paired with the interface contact is located may be correspondingly reduced, to reduce internal space of the electronic device, and facilitate lightness and thinness of the electronic device.

Figure 6:
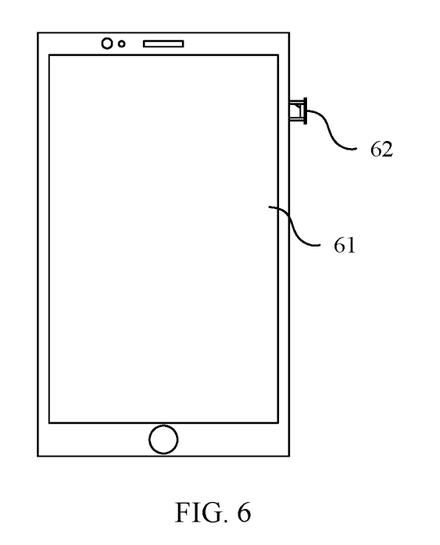
FIG. 6 is a schematic structural diagram of an embodiment of a mobile electronic device according to this application.

FIG. 6 is a schematic structural diagram of an embodiment of a mobile electronic device according to this application. The electronic device includes a device body 61 and a card tray 62 that can be embedded into the device body 61.

Figure 7:
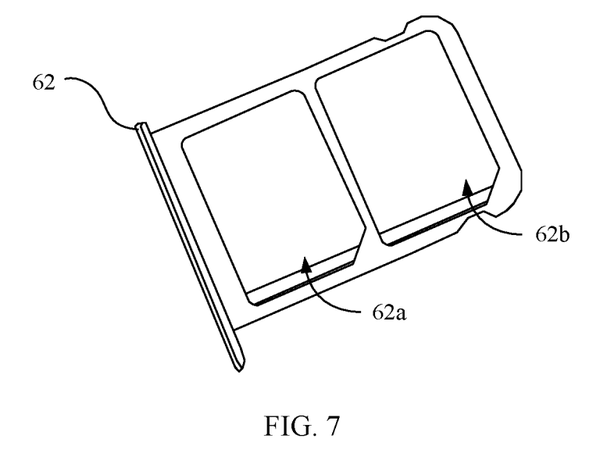
FIG. 7 is a schematic structural diagram of a card tray in an embodiment of a mobile electronic device according to this application.

FIG. 7 is a schematic structural diagram of a card tray in an embodiment of a mobile electronic device according to this application. The card tray 62 includes a SIM card slot 62a and a memory card slot 62b. Shapes of the SIM card slot 62a and the memory card slot 62b are the same, and the memory card slot 62b is configured to accommodate the multimedia card provided in the foregoing embodiments.

It may be understood that, in an embodiment, the shapes of the SIM card slot 62a and the memory card slot 62b are the same, but positions and functions of interface contacts disposed on the SIM card slot 62a and the memory card slot 62b are different. Therefore, different cards correspond to different external contact elastomers. Thus, a sequence of the SIM card slot 62a and the memory card slot 62b is not changeable. Optionally, corresponding signs may be printed on the card tray 62, so that a user can correctly place the SIM card slot 62a and the memory card slot 62b during installation.

In another embodiment, the two card slots may be alternatively placed horizontally, that is, a short edge of the SIM card slot 62a is adjacent to a short edge of the memory card slot 62b.

The shapes of the SIM card slot and the memory card slot on the embedded card tray of the mobile electronic device provided in this application are the same, so that a size of the memory card slot is reduced. An area of an internal circuit board of the electronic device can be correspondingly reduced, to reduce internal space of the electronic device, and facilitate lightness and thinness of the electronic device.

The foregoing descriptions are merely implementations of this application, but are not intended to limit the protection scope of this application. Any equivalent structure or equivalent procedure variation made by using the content of the specification and accompanying drawings of this application, or an application of the content of the specification and accompanying drawings of this application directly or indirectly to another related technical field shall fall within the protection scope of this application.

What is claimed is:

1. A multimedia card comprising a substrate, eight contacts, a transformer circuit disposed on the substrate, a control chip, and a memory chip, wherein:
    the eight contacts are disposed on the substrate,
    the multimedia card comprises a first edge, a second edge, a third edge, and a fourth edge,
    the first edge is parallel to the second edge,
    the third edge is parallel to the fourth edge,
    a distance between the first edge and the second edge is a first distance, a distance between the third edge and the fourth edge is a second distance,
    the first distance is greater than the second distance,
    a contact of the eight contacts is a power supply contact configured to receive a first voltage,
    the power supply contact is coupled to the transformer circuit, and the transformer circuit is configured to convert the first voltage into a second voltage,
    four contacts of the eight contacts are distributed along the first edge, and the other four contacts of the eight contacts are distributed along the second edge, the control chip and the memory card are covered with a packaging layer, and based on the multimedia card working in an HS200 mode, the memory chip is configured to receive the first voltage from the power supply contact, and the control chip is configured to receive the second voltage from the transformer circuit.

2. The multimedia card of claim 1, wherein the multimedia card complies with an Embedded Multi Media Card (eMMC) protocol.

3. The multimedia card of claim 1, wherein the first voltage is 3.3V and the second voltage is 1.8V.

4. The multimedia card of claim 1,
wherein the eight contacts comprise a first contact, a second contact, a third contact, a fourth contact, a fifth contact, a sixth contact, a seventh contact, and an eighth contact,
wherein the four contacts of the eight contacts distributed along the first edge comprise: the first contact, the second contact, the third contact, and the fourth contact distributed along the first edge,
wherein the other four contacts of the eight contacts distributed along the second edge comprise: the fifth contact, the sixth contact, the seventh contact, and the eight contact distributed along the second edge, and
wherein the fourth contact and the fifth contact are adjacent to the third edge, and a shape of the fourth contact is L shape, a shape of the fifth contact is L shape.

5. The multimedia card of claim 4, wherein the fourth contact comprises a first body part and a first extension part, the first extension part extends between the third contact and the first edge, the first body part is distributed along the third edge, and the fifth contact comprises a second body part and a second extension part;
wherein the second extension part extends between the sixth contact and the second edge, the second body part is distributed along the edge.

6. The multimedia card of claim 1,
wherein the eight contacts comprise a power contact, a ground contact, a clock contact, a command contact, a first data contact, a second data contact, a third contact, and a fourth data contact.

7. The multimedia card of claim 6,
wherein the four contacts of the eight contacts distributed along the first edge comprise: the second data contact, the command contact, the ground contact, and the fourth data contact distributed along the first edge,
wherein the other four contacts of the eight contacts distributed along the second edge comprise: the third data contact, the power contact, the first data contact, and the clock contact distributed along the second edge.

8. The multimedia card of claim 1, wherein a shape of the multimedia card is a shape of a nano-SIM card.

9. The multimedia card of claim 1, wherein a size of the multimedia card is a size of a nano-SIM card.

10. The multimedia card of claim 1, wherein the distance between the first edge and the second edge is 12.3 mm, and a distance between the third edge and the fourth edge is 8.8 mm.

11. The multimedia card of claim 1, wherein a chamfer is disposed between the first edge and the fourth edge.

12. A mobile electronic device comprising: a subscriber identification module (SIM) card slot and a memory card slot that are disposed on a same card tray, wherein the SIM card slot and the memory card slot have a same shape, and the memory card slot is configured to accommodate a multimedia card, wherein the multimedia card comprises a substrate, eight contacts, a transformer circuit disposed on the substrate, a control chip, and a memory chip, wherein:
the eight contacts are disposed on the substrate,
the multimedia card comprises a first edge, a second edge, a third edge, and a fourth edge,
the first edge is parallel to the second edge,
the third edge is parallel to the fourth edge,
a distance between the first edge and the second edge is a first distance, a distance between the third edge and the fourth edge is a second distance,
the first distance is greater than the second distance,
a contact of the eight contacts is a power supply contact configured to receive a first voltage,
the power supply contact is coupled to the transformer circuit, and the transformer circuit is configured to convert the first voltage into a second voltage,
four contacts of the eight contacts are distributed along the first edge, and the other four contacts of the eight contacts are distributed along the second edge,
the control chip and the memory card are covered with a packaging layer, and
based on the multimedia card working in an HS200 mode, the memory chip is configured to receive the first voltage from the power supply contact, and the control chip is configured to receive the second voltage from the transformer circuit.

13. The mobile electronic device of claim 12, wherein the multimedia card complies with an Embedded Multi Media Card (eMMC) protocol.

14. The mobile electronic device of claim 12, wherein the first voltage is 3.3V and the second voltage is 1.8V.

15. The mobile electronic device of claim 12,
wherein the eight contacts comprise a first contact, a second contact, a third contact, a fourth contact, a fifth contact, a sixth contact, a seventh contact, and an eighth contact,
wherein the four contacts of the eight contacts distributed along the first edge comprise: the first contact, the second contact, the third contact, and the fourth contact distributed along the first edge,
wherein the other four contacts of the eight contacts distributed along the second edge comprise: the fifth contact, the sixth contact, the seventh contact, and the eight contact distributed along the second edge, and
wherein the fourth contact and the fifth contact are adjacent to the third edge, and a shape of the fourth contact is L shape, a shape of the fifth contact is L shape.

16. The mobile electronic device of claim 15, wherein the fourth contact comprises a first body part and a first extension part, the first extension part extends between the third contact and the first edge, the first body part is distributed along the third edge, and the fifth contact comprises a second body part and a second extension part;
wherein the second extension part extends between the sixth contact and the second edge, the second body part is distributed along the edge.

17. The mobile electronic device of claim 12,
wherein the eight contacts comprise a power contact, a ground contact, a clock contact, a command contact, a first data contact, a second data contact, a third contact, and a fourth data contact.

18. The mobile electronic device of claim 17,
wherein the four contacts of the eight contacts distributed along the first edge comprise: the second data contact, the command contact, the ground contact, and the fourth data contact distributed along the first edge, wherein the other four contacts of the eight contacts distributed along the second edge comprise: the third data contact, the power contact, the first data contact, and the clock contact distributed along the second edge.

19. The mobile electronic device of claim 12, wherein a shape of the multimedia card is a shape of a nano-SIM card.

20. The mobile electronic device of claim 12, wherein a size of the multimedia card is a size of a nano-SIM card.

* * * * *